United States Patent
Viola et al.

(10) Patent No.: US 7,316,805 B1
(45) Date of Patent: Jan. 8, 2008

(54) LABORATORY CAP AND WELL FOR HANGING-DROP CRYSTALLIZATION METHODS

(75) Inventors: Jean-Pascal Viola, Ville d'Anjou (CA); Christian Houde, Montreal (CA)

(73) Assignee: QIAGEN, Inc., Toronto (CA)

( * ) Notice: Subject to any disclaimer, the term of this patent is extended or adjusted under 35 U.S.C. 154(b) by 445 days.

(21) Appl. No.: 09/913,088

(22) PCT Filed: Sep. 2, 2000

(86) PCT No.: PCT/CA00/00119

§ 371 (c)(1),
(2), (4) Date: Jan. 23, 2002

(87) PCT Pub. No.: WO00/47323

PCT Pub. Date: Aug. 17, 2000

(30) Foreign Application Priority Data

Feb. 9, 1999 (CA) .................................. 2261326

(51) Int. Cl.
*B01D 9/00* (2006.01)
(52) U.S. Cl. .................. 422/253; 422/245.1; 422/99
(58) Field of Classification Search ......... 422/99–102, 422/909, 916, 942
See application file for complete search history.

(56) References Cited

U.S. PATENT DOCUMENTS

| | | | |
|---|---|---|---|
| 2,366,886 A | 1/1945 | Van Tuyl | 206/3 |
| 3,107,204 A | 10/1963 | Brown et al. | 195/103.5 |
| 3,297,184 A | 1/1967 | Andelin | 215/41 |
| 3,537,956 A | 11/1970 | Falcone et al. | 195/139 |
| 3,597,326 A | 8/1971 | Liner | 195/139 |
| 3,649,464 A | 3/1972 | Freeman | 195/140 |
| 3,692,498 A | 9/1972 | Frank et al. | 23/292 |
| 3,729,382 A | 4/1973 | Shaffer et al. | 195/139 |
| 3,745,091 A | 7/1973 | McCormick | 195/139 |
| 3,860,136 A * | 1/1975 | Romney | 215/222 |
| 3,907,505 A | 9/1975 | Beall et al. | 23/259 |
| 4,038,149 A | 7/1977 | Liner et al. | 195/127 |
| 4,154,795 A | 5/1979 | Thorne | 422/99 |
| 4,495,289 A | 1/1985 | Lyman et al. | 435/284 |
| 4,599,314 A * | 7/1986 | Shami | 435/305.3 |
| 4,713,219 A | 12/1987 | Gerken et al. | 422/102 |
| 4,917,707 A | 4/1990 | Claramonte et al. | 23/300 |
| 5,271,795 A | 12/1993 | Ataka et al. | 156/621 |

(Continued)

FOREIGN PATENT DOCUMENTS

EP          0 810 030 A1      12/1997

(Continued)

OTHER PUBLICATIONS

International Search Report for PCT/CA00/00119 mailed May 16, 2000.

(Continued)

*Primary Examiner*—Yelena G. Gakh
(74) *Attorney, Agent, or Firm*—Schwartz Cooper Chartered

(57) ABSTRACT

The invention relates to a device for molecular and macromolecular crystallization. More particularly, the device comprises a well and a transparent cap for growing diffraction-quality protein crystals by conventional vapor diffusion techniques. The present device is particularly advantageous in that it allows the pre-filling of the well with a solution for transport and handling.

21 Claims, 5 Drawing Sheets

U.S. PATENT DOCUMENTS

| | | | | |
|---|---|---|---|---|
| 5,342,581 A | * | 8/1994 | Sanadi | 422/101 |
| 5,419,278 A | | 5/1995 | Carter | 117/206 |
| 5,846,489 A | | 12/1998 | Bienhaus et al. | 422/63 |
| 6,027,694 A | * | 2/2000 | Boulton et al. | 422/102 |
| 6,074,614 A | * | 6/2000 | Hafeman et al. | 422/102 |

FOREIGN PATENT DOCUMENTS

| | | |
|---|---|---|
| WO | WO 93/07311 | 4/1993 |

OTHER PUBLICATIONS

Lorber et al. "A Versatile Reactor for Temperature Controlled Crystallization of Biological Macromolecules," Journal of Crystal Growth, NL, North-Holland Publishing Co. Amsterdam, vol. 122, Nos. 1/4. Aug. 2, 1992, pp. 168-175.

Salemme "A Free Interface Diffusion Technique for the Crystallization of Proteins for X-Ray Crystallography," Archives of Biochemistry and Biophysics 151, pp. 533-539.

* cited by examiner

LABORATORY CAP AND WELL FOR HANGING-DROP CRYSTALLIZATION METHODS

FIELD OF THE INVENTION

The present invention relates to a device for handling molecular and macromolecular crystallization. More particularly, the device comprises a well and a cap assembly for growing protein crystals by conventional vapor diffusion techniques. The present device is particularly advantageous in that it facilitates the pre-filling of the well with a solution for transport and handling prior to utilization by a technician.

BACKGROUND OF THE INVENTION

Crystallography is an extremely useful tool for scientists, and is therefore a field of research attracting a lot of interest. It is a powerful means that provides precise and detailed description of the three-dimensional structure of the molecules, and is of great help in the understanding of their functions. Crystallography of macromolecules like proteins is extensively used today, academically as well as industrially.

Although three-dimensional structures of simple proteins have been obtained through crystallization methods, it is not always easy to obtain crystals from macromolecules. For example, the preferred conditions for the crystallization of a given molecule can take several hundreds if not thousands of trials. As a result, means and methods have been developed to perform a great number of trials relatively quickly, including hanging-drop and sitting-drop methods. All such methods use the benefit of vapor diffusion to obtain the crystals.

The hanging-drop method is currently the most commonly used technique for scanning various crystallization conditions of macromolecules, such as proteins. It comprises suspending a droplet of approximately 2 to 20 µL of solution containing the macromolecule to be crystallized and a precipitating agent, over a precipitating solution, such as conventional polyethylene glycol 20% or ammonium sulfate 40%, contained in a reservoir or well. The system is then sealed hermetically. After a while, vapor diffusion of the solvent or solvent mixtures between the droplet and the solution in the reservoir reaches equilibrium. The end result is a decrease of water in the droplet, and an increase of the macromolecule and precipitating agent concentration therein, thus causing crystallization of the macromolecule in optimized conditions. The actual technique for the set up of the hanging-drop or sitting-drop experiments is a long and arduous work and has to be performed by qualified and skilled technical personnel.

Conventionally, a commercially available tray made of an inert thermoplastic is material comprising a plurality of reservoirs or wells is prepared, and the precipitating solution is placed in each reservoir or well manually. The macromolecule solution is then mixed with a precipitating agent on a glass plate (coverglass) and the whole is inverted over the wells, thus making the macromolecule solution overhanging the well. Prior to placing a glass plate over a well, the rim of each well is greased to ensure a proper seal. Care must be taken when placing the plate over each well, since the grease can easily contaminate the macromolecule solution. The crystallization process is followed with the help of a microscope. After the crystal is obtained, the glass plate is removed. Again, this must be done with great care to prevent contamination of the crystallized macromolecule with grease, and/or breaking of the glass plate. On top of that, the plates are hardly reusable for any experiment because the grease is hard to remove, and some of it remains on the plates.

An advantage of the hanging-drop and sitting-drop methods is that they provide screening conditions for crystallization, and truly represent a microcrystallization technique. The vapor diffusion in the hanging or sitting drop allows screening of a large range of conditions and necessitates a relatively small amount of macromolecules. Further, it allows a relatively clear visualization of the results, and the eventual crystals are free, i.e., they do not adhere or are stuck to any surface.

Typically, several hundreds of experiments are required to find appropriate crystallizing conditions for the production of high quality crystals. Accordingly, hanging-drop and sitting-drop experiments are a very labor-intensive process demanding skilled and experienced technical personnel. For example, multiple aspirating and dispensing steps of components, multiple greasing steps etc. must be performed in the experimental set up. Further, for each well, a separate coverglass must be manually inverted. The number and complexity of steps can therefore produce an undesirable wide variation in experimental results.

As stated above, grease is conventionally used to provide a seal between the well and the coverglass. Other ways for sealing the system have been proposed. For example, grease can be replaced with immersion oil or an adhesive tape. As with grease, these sealing means have serious drawbacks. Grease is not always easy to dispense around the upper rim of the well, and is a time consuming operation. Technicians repeating the operation thousands of times occasionally suffer physical pain to their hands. Other significant problems and risks are present when manipulating the crystal on a greasy cover slide. The cover slide sometimes breaks during the process, which may cause injury to the technician, in addition to loosing the crystals. The immersion oil is also problematic. One has to use a determined volume of oil. Too much oil leads to contamination within the well, while not enough will lead to non-hermetic seal that may result in the evaporation of the precipitating solution. An adhesive tape allows quicker and simpler manipulations, but all experiments are sealed at the end of the set-up, thus introducing experimental variations between the $1^{st}$ and the $24^{th}$ drop. Further, crystals often stick to the tape, rendering impossible the recovery of the crystals, and the operations for the recovery of the drop are also problematic.

These conditions promoted the robotization of the procedure. Some automated crystallization devices already exist. The well-known Cyberlab-200™ apparatus dispenses solutions in wells, greases the upper rim of each well, pours droplets on cover slides held by a vacuum arm, and places the cover slides over the wells. However, such apparatus still has some drawbacks, namely a complicated experimental set-up, and the notable use of grease. Further such apparatus is extremely expensive.

Relevant references in the field include U.S. Pat. No. 2,366,886; U.S. Pat. No. 3,107,204; U.S. Pat. No. 3,297,184; U.S. Pat. No. 3,537,956; U.S. Pat. No. 3,597,326; U.S. Pat. No. 3,649,464; U.S. Pat. No. 3,692,498; U.S. Pat. No. 3,729,382; U.S. Pat. No. 3,745,091; U.S. Pat. No. 3,907,505; U.S. Pat. No. 4,038,149; U.S. Pat. No. 4,154,795; U.S. Pat. No. 4,495,289; U.S. Pat. No. 4,917,707; U.S. Pat. No. 5,271,795;

It would therefore be highly desirable to develop a device for crystallizing macromolecules that would overcome the above deficiencies. Such device would eliminate the requirement of external means like grease, oil or an adhesive tape to seal the well and the cover, and would preferably be easy to manipulate, either manually or automatically. Ultimately, the process of experimental set up of the device would be greatly facilitated and accelerated, while simultaneously eliminating possible risks of contamination of the eventual crystals. Finally, such device should be usable for various crystallization processes such as hanging-drop or sitting-drop processes.

SUMMARY OF THE INVENTION

In accordance with the present invention, there is provided a tray comprising a top surface, a bottom, an upright circumferential wall extending from the top surface to the bottom, and a plurality of wells extending downwardly from, and being open at, the top surface, for receiving a precipitating solution; and a cap provided for each well, each cap comprising locking members for locking the cap onto the well in a sealed manner. Such tray is particularly advantageous for growing molecular and macromolecular crystals.

IN THE DRAWINGS

DETAILED DESCRIPTION OF THE INVENTION

Figure 1:
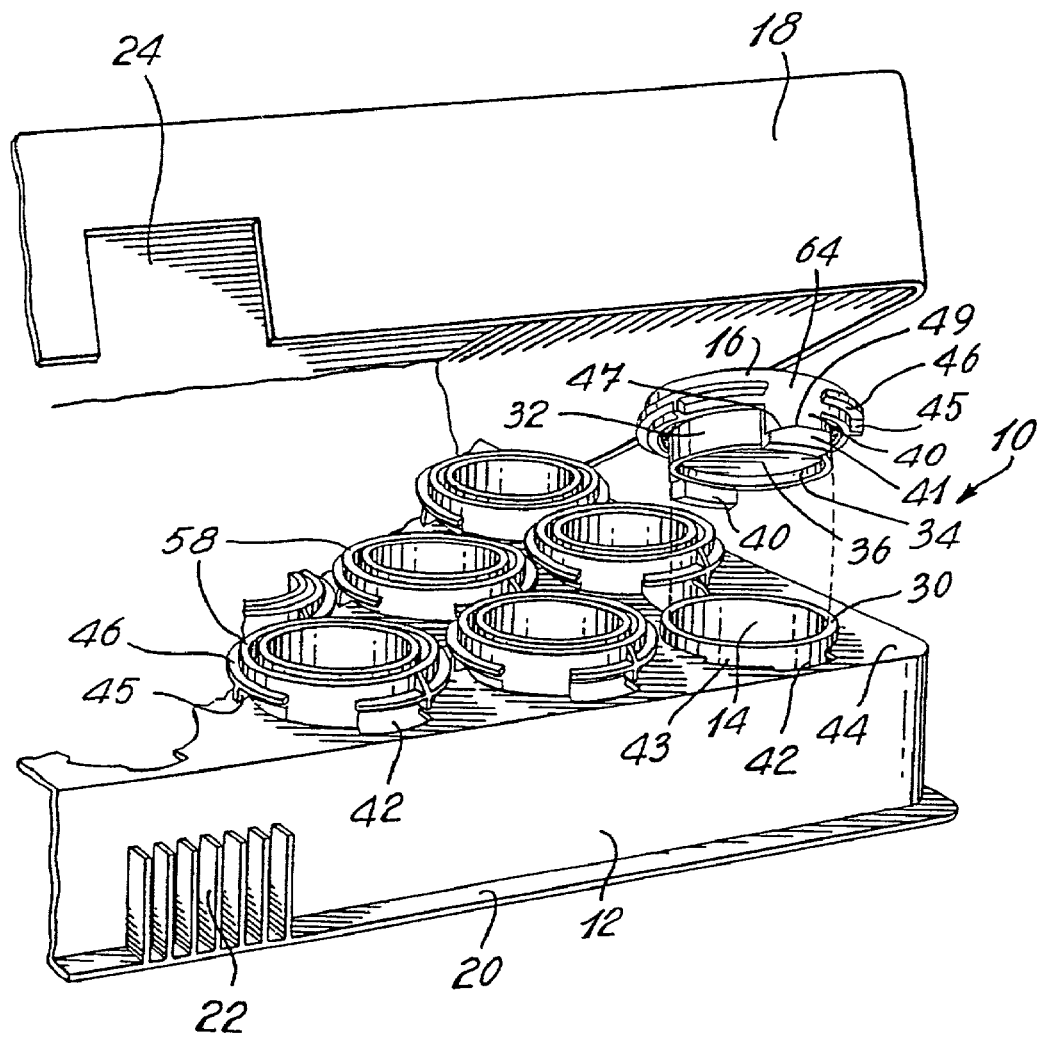
FIG. 1 illustrates perspective view of a first cap and well assembly in accordance with the present invention.

It is an object of the present invention to provide a crystal forming device using vapor diffusion method. The device comprises a well and a transparent cap designed to close the well and form a sealed volume, the well being sealed without the need to add a sealing material like grease, oil, adhesive tape and the like between the well and the cap. The cap is made of transparent material to allow examination and monitoring of crystal growth, as well as manipulation of the crystal under a microscope. The present device therefore represents an important advance in methods for growing crystals of macromolecules, especially in the field of hanging-drop and sitting-drop.

Because of its simplicity, the operations of filling the well with the precipitating solution, placing a drop of the macromolecule solution onto the cap and sealing the well by putting the cap in position over the well can be accomplished by any competent technician, and not only skilled personnel.

In a preferred embodiment of the invention, a plurality of wells are molded together, for example in a tray comprising 4 rows of 6 wells each, with corresponding transparent caps are provided thereon. The resulting tray and caps may also be optionally treated with a hydrophobic agent such as a siliconing agent.

Because of the transparency of the cap and of the bottom surface of the well, crystallization can be followed with minimal handling, and without disturbing the vapor equilibrium within each well. Further, visualization of the results under the microscope are simple because the cap is made of a transparent or translucent (clear) material.

Preferably, the material of the tray and the cap are the same, and comprise materials that can be molded easily at a reasonable cost. The material should be stable for extended periods of time towards the various chemical products present in the well and onto the cap. The material should also preferably not absorb water, and be good optical quality to facilitate work and observation under a microscope. Example suitable materials include various thermoplastics such as polystyrene, polypropylene, polycarbonate, polyacrylate, polymethacrylate, acrylonitrile-styrene copolymers, nitrile-acrylonitrile-styrene copolymers, polyphenyleneoxide, plienoxy resins, etc., the most preferred material being polystyrene.

It is another object of the present invention to provide a crystal-forming device that allows the manipulation of the growth crystals under the microscope without any transfer from the cap, where solutions can be added directly without any transfer of the crystals, in a greaseless environment.

Another major advantage of the device of the present invention is that once a series of experiments is completed, the tray is readily reusable, simply by taking another series of caps containing a drop of a solution containing a macromolecule to be crystallized, and reinstalling the caps over the wells. Further, a given cap may be removed from its original well and locked onto another one containing a different precipitating solution.

The invention is also concerned with a method for forming crystals of a macromolecule, the method comprising the steps of dispensing a precipitating solution in a well; forming a droplet in a cap comprising locking members to lock the cap over the well; and locking and sealing the well. In a preferred embodiment, a ring made of an elastomeric material like polypropylene, an ethylene-propylene copolymer, Teflon™ etc., is preferably provided between the cap and the well. In a further preferred embodiment, the well can be filled in advance and tightly sealed, so that they a tray is provided to a technician in a "ready-to-use" manner.

Because of the ergonomics of the present invention, the cap is engaged easily so that there is no need for special manual dexterity comparatively to the use of conventional thin, fragile, microscope coverglasses. The presence of a cavity in the surface of the cap facing the bottom surface of the well allows the addition of liquid directly over the drop, after placing the cap upside down on a table, without the need to transfer the crystals to another well, thus limiting the manipulations that might ruin the fragile crystals.

The use of the cap and well assembly of the present invention can be automated in a straightforward manner by providing the extremity of an automated arm with a simple grip element having an end provided with a structure adapted to releasably grip the cap. There is no need for the application of grease or the manipulation of fragile coverglass pieces. The grip element may also be manipulated manually by a technician, as described hereinbelow.

The cap and well assembly of the present invention also finds applications in the field of cell cultures, molecular or cellular biology etc.

In a most preferred embodiment of the invention, the well is filled beforehand and sealed with the cap. The technician therefore receives a "ready-to-use" assembly, thus eliminating the time-consuming operation of filling each well with the appropriate precipitating solution. The buyer may therefore order as many assemblies as desired with the same or different precipitating solutions. For shipping purposes, the cap may be replaced on the assembly with a film to prevent contact of the precipitating solution with the cap. Such contact would necessitate the cleaning of the cap prior to its use. One may also use a cap for shipping purposes, and a different cap to carry out the experiments. It is important that the well be sealed to avoid evaporation and spilling of the precipitating solution, either during shipment of the pre-filled wells, or during the experiments.

Referring to the drawings which illustrate preferred embodiments of the invention, FIG. 1 illustrates a cap and well assembly 10 which comprises a tray or base plate 12 provided with a plurality of wells 14 and corresponding caps 16. Assembly 10 may also include a cover 18 used for shipping or storage purposes. The preferred form of cover 18 comprises with an insertion (not shown) at each corner that allows retention of the cover over the caps without touching them. Cover 18 further allows the storage of several trays of experiments one on top of the other. Tray 12 comprises a rim 20 extending about the four side walls thereof, and is provided with finger grip surfaces 22 such as those described in U.S. Pat. No. 4,038,149, on two opposed side walls for easier handling of the tray by the technician. Finger grip surfaces 22 are provided to avoid mishaps, and greatly facilitate handling of covered and uncovered trays. Cover 18 comprises a section 24 adapted to engage around finger grip surfaces 22 for proper fitting over assembly 10.

Figure 2:
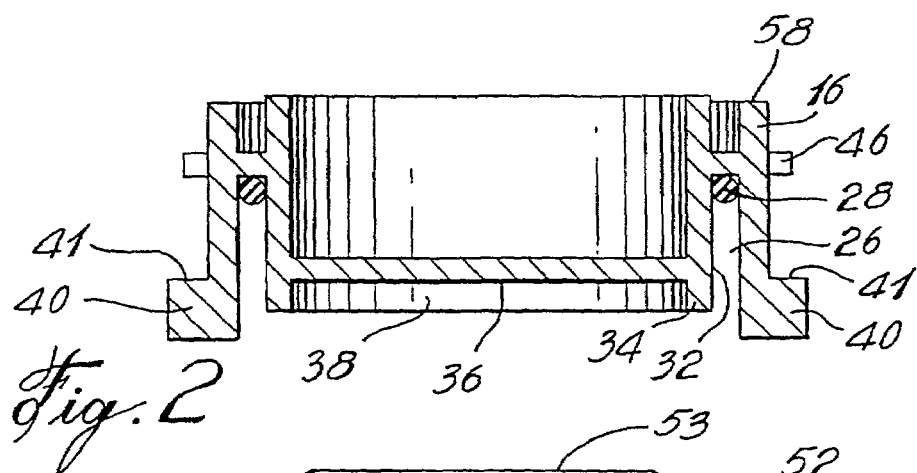
FIG. 2 illustrates a section view of a preferred embodiment of a cap.

FIG. 2 illustrates a section view of cap 16. As it can be seen, cap 16 comprises a cylindrical slot 26 into which is inserted an O-ring element 28 made of a resilient material. Such material, although optional, is provided to ensure an appropriate seal when cap 16 is fitted over upper rim 30 of well 14. The inner surface 32 of slot 26 has a portion or ridge 34 extending passed the planar surface 36 thereby forming a cavity 38. Surface 36 may be concave or convex, but the planar configuration illustrated on FIG. 2 is much preferred. As stated above, the material of cap 16 is such that it is sufficiently transparent or translucent so that cap 16 can be placed directly under a microscope for observation and/or manipulation of the crystals.

Each cap 16 comprises a pair of locking element 40 diametrically opposed to each other and comprising a ridge portion 41. Cap 16 also comprises a further rim 46 provided with a series of spacer 45 underneath. Once the precipitating solution is poured into well 14, the technician puts cap 16 upside down on a flat surface and places a drop of the macromolecule-containing solution onto surface 36. Cap 16 is then flipped over cautiously, and each locking element 40 is inserted into a corresponding opening 42 provided onto the upper surface 44 of tray 12 until the abutment of upper rim 30 of well 14 with the O-ring element 28 inside slot 26 is achieved. Cap 16 is then rotated so that locking elements 40 slide each into a slot 43 having a width smaller than that of opening 42 and extending on a portion of the periphery of well 14 until the upper surface of portion 41 is entirely under upper surface 44, thereby efficiently sealing well and maintaining cap 16 in place. In a most preferred embodiment, a section 47 of portion 41 is tapered to facilitate sliding under upper surface 44. To ensure even better locking and maintenance of the cap in position, a small bump (not shown) is provided onto section 49 that is adapted to fit into a corresponding recess (not shown) present under surface 44 after complete insertion of portion 41 under surface 44.

Figure 3:
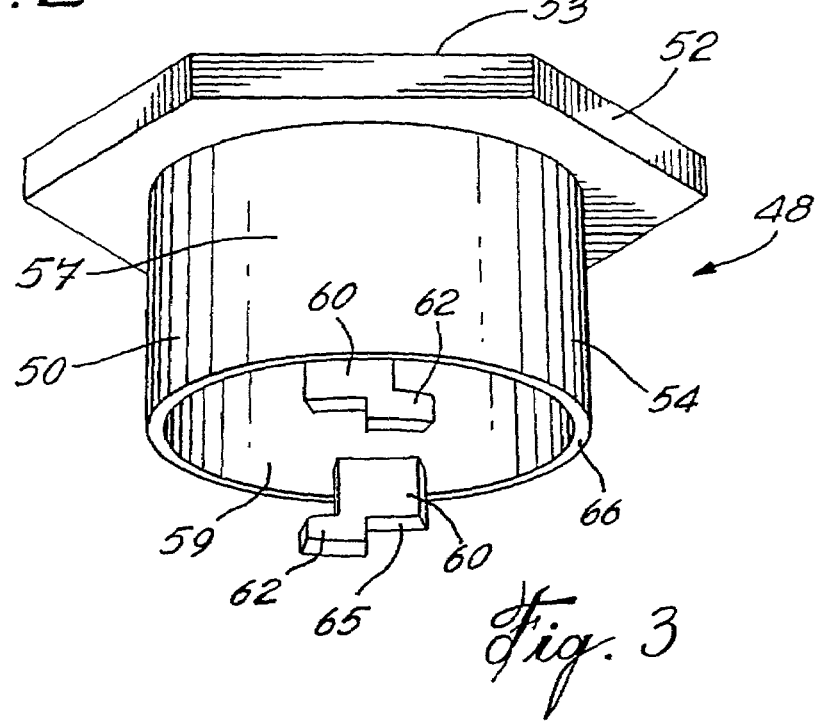
FIG. 3 illustrates a perspective view of a tool adapted to install and remove a cap from the well.
Figure 4:
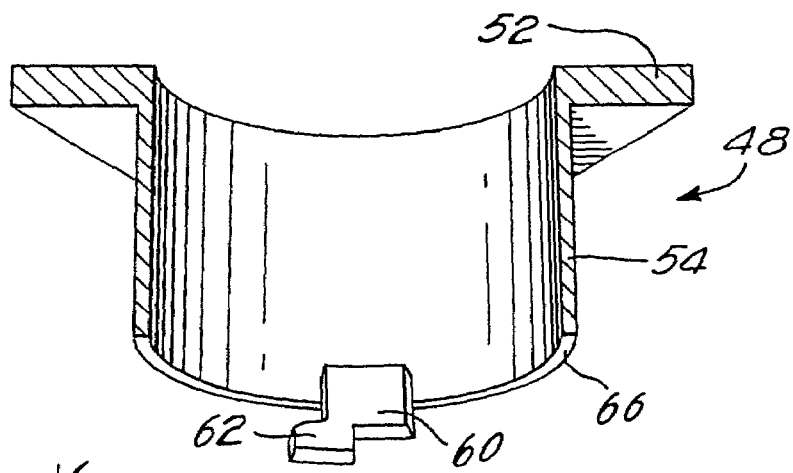
FIG. 4 illustrates a section view of the tool of FIG. 3.

To put cap 16 in place onto well 14, or for removal therefrom, a tool 48 may be used, as illustrated in FIGS. 3 and 4. Tool 48 comprises a body 50 divided in a portion 52 shaped in a manner such as to facilitate holding by the technician or an automated arm; a cylindrical portion 54 with an external surface 57 having a circumference slightly bigger than that of rim 46, and an internal surface 59 having a circumference slightly smaller than that of rim 46. Tool 48 further comprises two diametrically opposed cap gripping elements 60 each provided with a gripping finger 62. The gripping element 60 can be provided onto internal surface 59, directly on rim 66, or onto external surface 57. In operation, tool 48 is placed over cap 16 so that each finger 62 is inserted into a slot 64 cut into rim 46 until at least a portion 65 of each element 60 is abutted onto rim 46. Tool 48 is then rotated until gripping fingers 62 are completely engaged under rim 46, and the rotation is maintained until the locking members 40 are aligned with slots 42. Cap 16 is then simply pulled up. To reintroduce the cap in position, the procedure is carried out in an opposite manner. The external surface 53 of portion 52 should be planar, so that it can be laid on a table or under a microscope in a stable manner, and allow the technician to observe and/or work on the crystals. To be able to work under a microscope directly, surface 53 must comprises an opening preferably corresponding to the internal diameter of cylindrical portion 54 (see FIG. 4).

Figure 5:
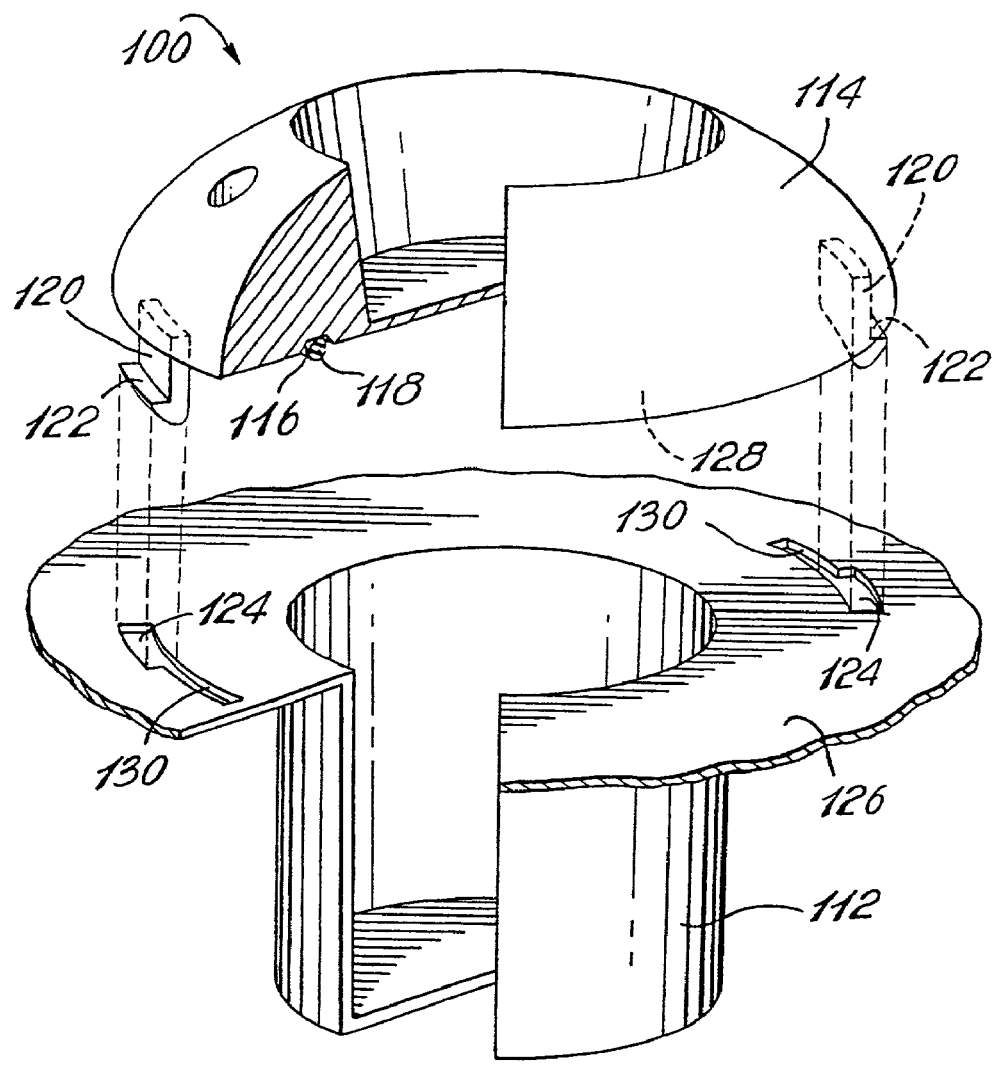
FIGS. 5, 6 and 7 illustrate other embodiments of the cap and well assembly according to the present invention.

FIG. 5 illustrates another embodiment of the present invention. The cap and well assembly 100 which comprises a tray or base plate (not shown) provided with a plurality of wells 112 and corresponding cap 114, which comprises a cylindrical slot 116 into which is inserted an O-ring element 118 made of a resilient material. As for the previous embodiment illustrated, the O-ring, although optional, is provided to ensure an appropriate seal.

Each cap 114 comprises a pair of locking element 120 diametrically opposed to each other and comprising a ridge portion 122. Cap 114 is locked into position on the tray by inserting each locking element 120 into a corresponding opening 124 provided onto the upper surface 126 of the tray until the lower surface 128 of cap 114 lies flat onto the tray upper surface 126. Cap 114 is then rotated so that locking elements 120 slide into a slot 130 having a width smaller than that of opening 124 and extending on a portion of the periphery of well 112 until the upper surface of ridge portion 122 is entirely under upper surface 126, thereby efficiently sealing well and maintaining cap 114 in place.

Figure 6:
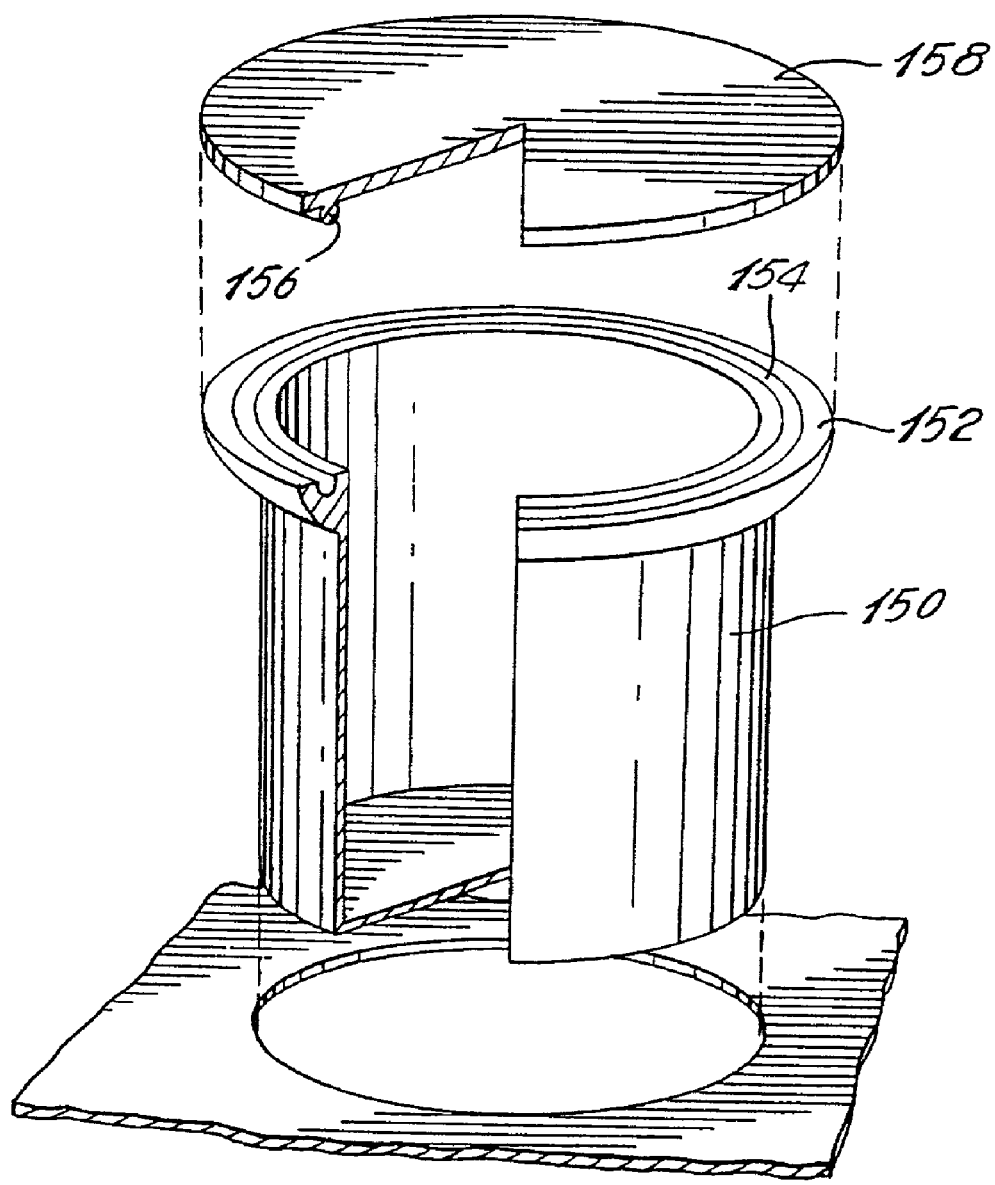

FIG. 6 illustrates another simple variation of the present invention, wherein the upper surface 152 of a well 150 comprises a slot 154 along its circumference and adapted to receive an O-rig element 156 coupled to a cap 158. The section of slot 154 is such that is slightly smaller than that of element 156, so that upon insertion into the slot, a tight seal is formed by the locking of cap 158 to well 150 without the need of any adhesive or grease.

Figure 7:
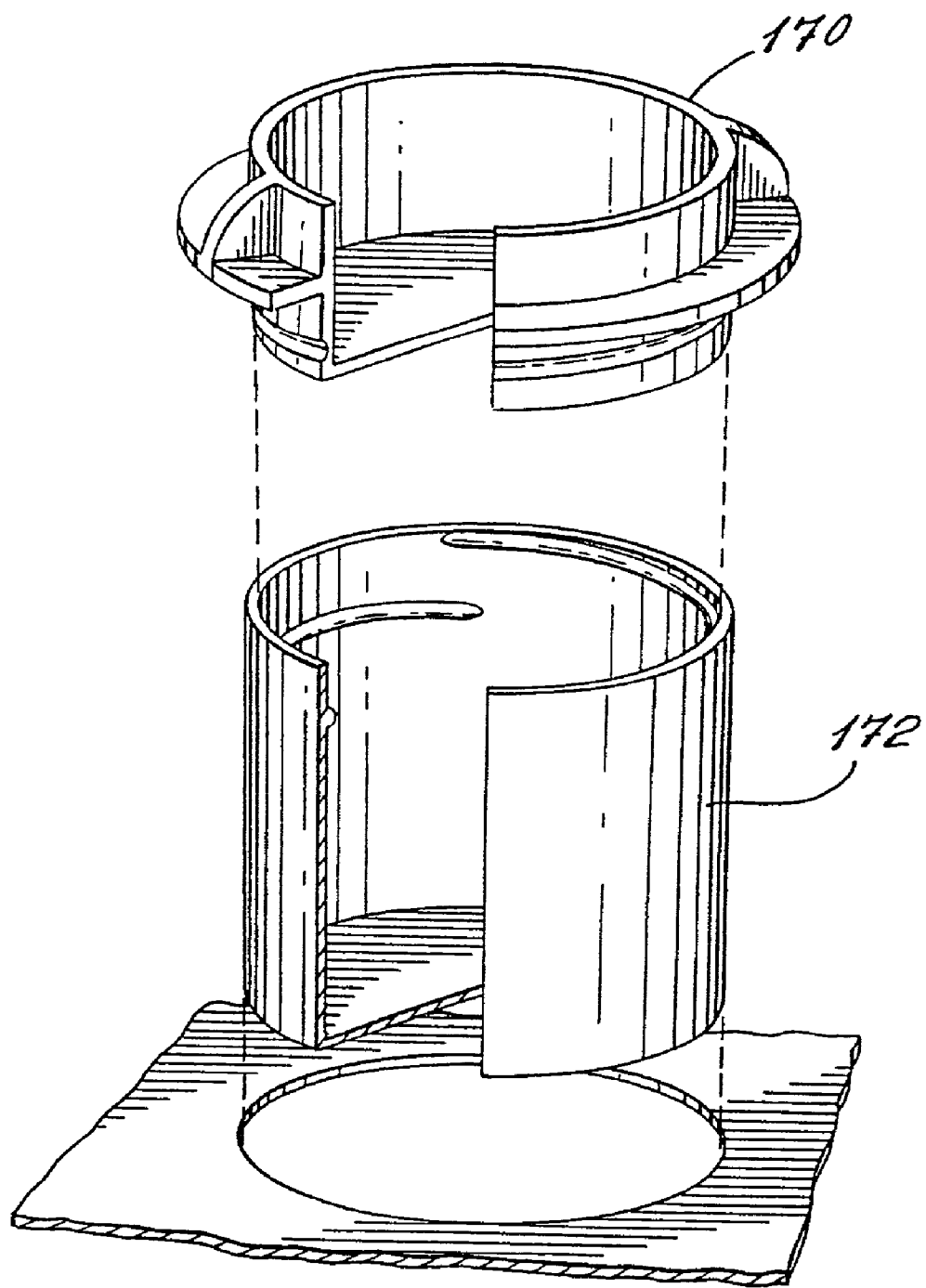

FIG. 7 illustrates yet another embodiment of the invention, wherein the cap 170 is screwed on the well 172. This construction as well as the one illustrated in FIGS. 1, 2 and 5 provides for gradual engagement of the locking mechanism of the cap with the well for movement between a released position and a locked position.

The present cap and well assembly is particularly suitable for both hanging-drop or sitting-drop crystallization methods. With respect to the sitting-drop method, although not specifically illustrated in the drawings, anyone skilled in the art will readily appreciate that any conventional drop support can be inserted or molded into the well. Examples of such sitting-drop support include the Micro-Bridges or the glass sitting drop rods manufactured and sold by Hampton Research (Laguna Hills, Calif.).

Each well is carefully filled with a selected equilibrating solution. Subsequently, a selected protein drop is deposited on the cap. The shape and the texture of the lower surface can be varied to obtain optimum results for a particular protein solution being crystallized, for example, when lower surface tension solutions, including protein solutions containing detergents, are used. The addition of the equilibrating solution and the protein drops to the device may be carried out either manually or through commercial automated pipetting apparatus, and the sealing of the cap over the solution may also be carried out manually or in an automated manner.

While the invention has been described in connection with specific embodiments thereof, it will be understood that it is capable of further modifications and this application is intended to cover any variations, uses or adaptations of the invention following, in general, the principles of the invention and including such departures from the present description as come win known or customary practice within the art to which the invention pertains, and as may be applied to the essential features hereinbefore set forth, and as follows in the scope of the appended claims.

What is claimed is:

1. A crystal-forming device for forming crystals by vapor diffusion, comprising:
   a tray having a base and an upright peripheral wall extending from the base supporting an upper tray surface;
   a plurality of wells supported by the upper tray surface for holding a precipitating solution with each well having an open upper end and a light transmitting bottom; and,
   a plurality of removable caps to cover and seal the open upper ends of the wells and for supporting the crystallization within each well,
   a plurality of resilient members, each resilient member disposed and creating a seal between each cap and each well,
   each cap having on an underside thereof a ridge with a distal edge that forms a cavity with a transparent crystallization support therein, the support being spaced from the distal edge of the ridge confronting the well, for suspending a droplet of solution to be crystallized over the precipitating solution in each well the ridge circumscribing the support for preventing the droplet of solution from spreading beyond the support, and
   a first integral locking member associated with each cap for structurally engaging a corresponding second locking member associated with each well to releasably interlock the cap to the well in a sealed manner without the need or use of a contaminating sealing material between the cap and the well; and
   wherein the combination of the light transmitting bottom and the transparent crystallization support allows visual examination and monitoring through the crystallization support of crystal growth within the well under a microscope.

2. The crystal-forming device according to claim 1 wherein the well and the cap are cylindrical.

3. The crystal-forming device according to claim 2 wherein each cap comprises a rim onto its external surface thereof, the rim comprising equally spaced apart slots.

4. The crystal-forming device according to claim 1 wherein each well has a rim which extends above the top surface of the tray.

5. The crystal-forming device according to claim 4 wherein the cap is tubular and said first locking member comprises locking elements equally spaced apart and extending from said cap, each locking element being insertable into a corresponding opening in a surface of the tray adjacent the rim of the well.

6. The crystal-forming device according to claim 5 wherein each cap comprises a tubular section spaced apart from and formed around an external surface of the cap, thereby defining an annular cavity therebetween that is closed at the top thereof, an annular cavity being adapted to receive therein the rim of an associated well, the locking elements extending from the tubular section.

7. The crystal-forming device according to claim 5 wherein each locking element comprises a tongue extending from top to bottom of the cap, the tongue comprising a portion extending radially away from the cap.

8. The crystal-forming device according to claim 1 wherein the resilient members comprise an elastomeric material.

9. The crystal-forming device according to claim 8 wherein the resilient member comprising the elastomeric material is inserted into the slot between the rim of the well and the top of the slot.

10. The crystal-forming device according to claim 1 wherein the cavity has a flat bottom surface.

11. The crystal-forming device according to claim 10 wherein the cavity comprises a circumferential wall extending perpendicularly to the flat bottom surface.

12. The crystal-forming device according to claim 1 further comprising a cover disposed over and around the tray.

13. The crystal-forming device according to claim 1 further comprising equally spaced apart finger grip surfaces on the peripheral wall.

14. The crystal-forming device according to claim 1 wherein the tray and the cap are made of a transparent or translucent material.

15. The crystal-forming device according to claim 14 wherein the material is selected from a group of materials consisting of: polystyrene, polypropylene, polycarbonate, polyacrylate, polymethacrylate, acrylonitrile-styrene copolymers, nitrile-acrylonitrile-styrene copolymers, polyphenyleneoxide, phenoxy resins, and mixtures thereof.

16. The crystal-forming device according to claim 1, wherein said first locking member and said second locking member are gradually engageable between a released position and a locked position.

17. The crystal-forming device according to claim 16, wherein said first and second locking members are rotatably engageable with one another between said released position and said locked position.

18. The crystal-forming device according to claim 17, wherein said first and second members includes inter-mating threads respectively on each of said caps and each of said wells.

19. A crystal-forming device for forming crystals by vapor diffusion, comprising:
   a tray having a base and an upright peripheral wall extending from the base supporting an upper tray surface;
   a plurality of wells supported by the upper tray surface for holding a precipitating solution with each well having an open upper end and a light transmitting bottom; and,
   a plurality of removable caps to cover and seal the open upper ends of the wells and for supporting the crystallization within each well,
   each cap defining a cavity with a transparent crystallization support therein for confronting the well and suspending a droplet of solution to be crystallized over the precipitating solution in each well,
   a seal between each cap and each well, and
   a first integral threading member associated with an external surface of each cap for structurally engaging a corresponding second threading member associated with an internal surface of each well to releasably interlock the cap to the well at a location external of the cavity in a sealed manner without the need or use of a contaminating sealing material between the cap and the well; and wherein the combination of the light transmitting bottom and the transparent crystallization support allows visual examination and monitoring through the crystallization support of crystal growth within the well under a microscope.

20. A method for forming molecular or macromolecular crystals, comprising the steps of: providing the crystal-forming device of claim 1 or claim 19, dispensing a precipitating solution in at least one well, providing a droplet of a solution containing a molecule or macromolecule on the transparent crystallization support of at least one cap corresponding the at least one well, inverting the at least one cap over the at least one well so that the droplet is suspended over the precipitating solution contained in the at least one well, and engaging said first and second locking means to simultaneously interlock said at least one cap on said at least one well and seal the at least one well.

21. The method according to claim 20, wherein the step of engaging includes rotating the first and second locking means relative to one another.

* * * * *

UNITED STATES PATENT AND TRADEMARK OFFICE
CERTIFICATE OF CORRECTION

PATENT NO.        : 7,316,805 B1
APPLICATION NO.   : 09/913088
DATED             : January 8, 2008
INVENTOR(S)       : Jean Pascal Viola and Christian Houde Page 1 of 1

It is certified that error appears in the above-identified patent and that said Letters Patent is hereby corrected as shown below:

On the Title Page, "PCT Filed: Sep. 2, 2000" should read --"PCT Filed: Feb. 9, 2000"--

Signed and Sealed this

Third Day of June, 2008

JON W. DUDAS
*Director of the United States Patent and Trademark Office*